(12) United States Patent
Arasnia et al.

(10) Patent No.: US 6,951,220 B1
(45) Date of Patent: Oct. 4, 2005

(54) METHOD OF DECONTAMINATING EQUIPMENT

(75) Inventors: Farzad Arasnia, San Mateo, CA (US); Paul R. Besser, Sunnyvale, CA (US); Minh V. Ngo, Fremont, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 148 days.

(21) Appl. No.: 10/288,157

(22) Filed: Nov. 5, 2002

(51) Int. Cl.[7] ................................................ B08B 9/00

(52) U.S. Cl. .............................. 134/22.1; 134/2; 134/3; 134/19; 134/902; 438/905

(58) Field of Search ........................... 134/2, 3, 19, 21, 134/22.1, 902; 438/905

(56) References Cited

U.S. PATENT DOCUMENTS

| | | | | |
|---|---|---|---|---|
| 5,358,895 A | * | 10/1994 | Steele et al. | 117/84 |
| 5,833,290 A | * | 11/1998 | Curelop et al. | 204/97 |
| 5,899,752 A | * | 5/1999 | Hey et al. | 438/791 |
| 6,605,520 B2 | * | 8/2003 | Cheong | 438/592 |
| 2003/0221708 A1 | * | 12/2003 | Ly et al. | 134/18 |

FOREIGN PATENT DOCUMENTS

JP 2000-38674 * 2/2000

* cited by examiner

Primary Examiner—M. Kornakov
(74) Attorney, Agent, or Firm—Foley & Lardner LLP

(57) ABSTRACT

A method of performing decontamination of a chamber for use in an IC fabrication system includes providing wet oxygen or a mixture comprising hydrochloric gas and oxygen in the chamber and raising the temperature in the chamber from a first lower temperature to a second higher temperature to cause the wet oxygen or the mixture comprising hydrochloric gas and oxygen to react with the germanium.

20 Claims, 5 Drawing Sheets

METHOD OF DECONTAMINATING EQUIPMENT

FIELD OF THE INVENTION

The present invention relates generally to integrated circuit (IC) fabrication equipment. More particularly, the present invention relates to a system for and a method of cleaning IC fabrication equipment.

BACKGROUND OF THE INVENTION

Semiconductor or integrated circuit (IC) fabrication techniques utilize equipment which must be cleaned of contaminants. In one example, the fabrication of germanium-containing ICs utilizing strained silicon (SMOS) can contaminate IC fabrication equipment or processing tools. The downtime or maintenance time associated with fabrication equipment is extended due to germanium contamination. Once the equipment is cleaned or decontaminated, the equipment can be utilized to continue to manufacture or fabricate ICs.

In conventional SMOS processes, germanium is implanted, deposited, or otherwise provided to silicon layers to change the lattice structure of the silicon and increase carrier mobility. IC fabrication equipment that tends to become contaminated with germanium can include deposition chambers, furnaces, diffusion equipment, etching tools, etc. The quartzware associated with such equipment is typically susceptible to germanium contamination.

Germanium contamination is becoming a more serious issue as IC fabrication processes explore the advantages of the higher carrier mobility of strained silicon (SMOS) devices. Germanium contamination is particularly problematic when equipment is used in both non-germanium and germanium fabrication lines. Shared equipment must be purged of germanium contamination before it is used in non-germanium processes, because such contamination is particularly damaging to materials used during conventional IC fabrication. Further, high levels of germanium contamination can be problematic even for strained silicon (SMOS) processes.

Flash devices are particularly sensitive to low level germanium contamination, because Flash technology uses IC structures and processes that are incompatible with germanium. For example, germanium contamination may cause data retention problems for the Flash memory cell. It is nevertheless desirous to use equipment associated with the Flash fabrication line in the manufacture of germanium containing products (e.g., SMOS products).

Thus, there is a need for an efficient process for decontaminating equipment. Further, there is a need for a system and a method which reduces the maintenance time required when a chamber must be purged of germanium contamination. Even further, there is a need for a fabrication equipment which can be utilized in strained silicon processes and can be decontaminated of germanium. Yet further there is a need for a process which decontaminates equipment which is used in germanium and non-germanium processes. Further, there is a need for a decontamination process that allows shared equipment to be used in both a Flash production line and a germanium production line.

SUMMARY OF THE INVENTION

An exemplary embodiment relates to an integrated circuit (IC) fabrication system. The IC fabrication system is configured for decontamination of germanium. The IC fabrication system includes a chamber and a means for providing a gas. The gas contains wet oxygen or hydrochloric acid and is provided in the chamber at elevated temperature. The gas reacts with the germanium to form a volatile material. The chamber is decontaminated of germanium due to the provision of the gas.

Another exemplary embodiment relates to a method of performing decontamination of a chamber for use in an IC fabrication system. The chamber is exposed to germanium. The method includes providing hydrochloric acid or wet oxygen in the chamber and raising the temperature in the chamber from a first lower temperature to a second higher temperature to cause the hydrochloric acid or wet oxygen to react with the germanium.

Still another exemplary embodiment relates to a method of decontaminating equipment utilized in an SMOS process. The method includes providing a gas containing wet $O_2$ (wet oxygen) or HCl and cycling the gas between a low temperature and a high temperature.

BRIEF DESCRIPTION OF THE DRAWINGS

Exemplary embodiments will hereafter be described with reference to the accompanying drawings, wherein like numerals denote like elements, and.

DETAILED DESCRIPTION OF PREFERRED EXEMPLARY EMBODIMENTS

Germanium contamination can be reduced through an advantageous control protocol. The protocol can allow pre-clean steps, diffusion furnace clean-up, and clean-up steps for processing equipment such as low pressure chemical vapor deposition (LPCVD) tools and etch equipment. The protocol can allow equipment to be shared with equipment used with a Flash production line, thereby increasing the efficiency and flexibility of SMOS or silicon-germanium fabrication.

Figure 1:
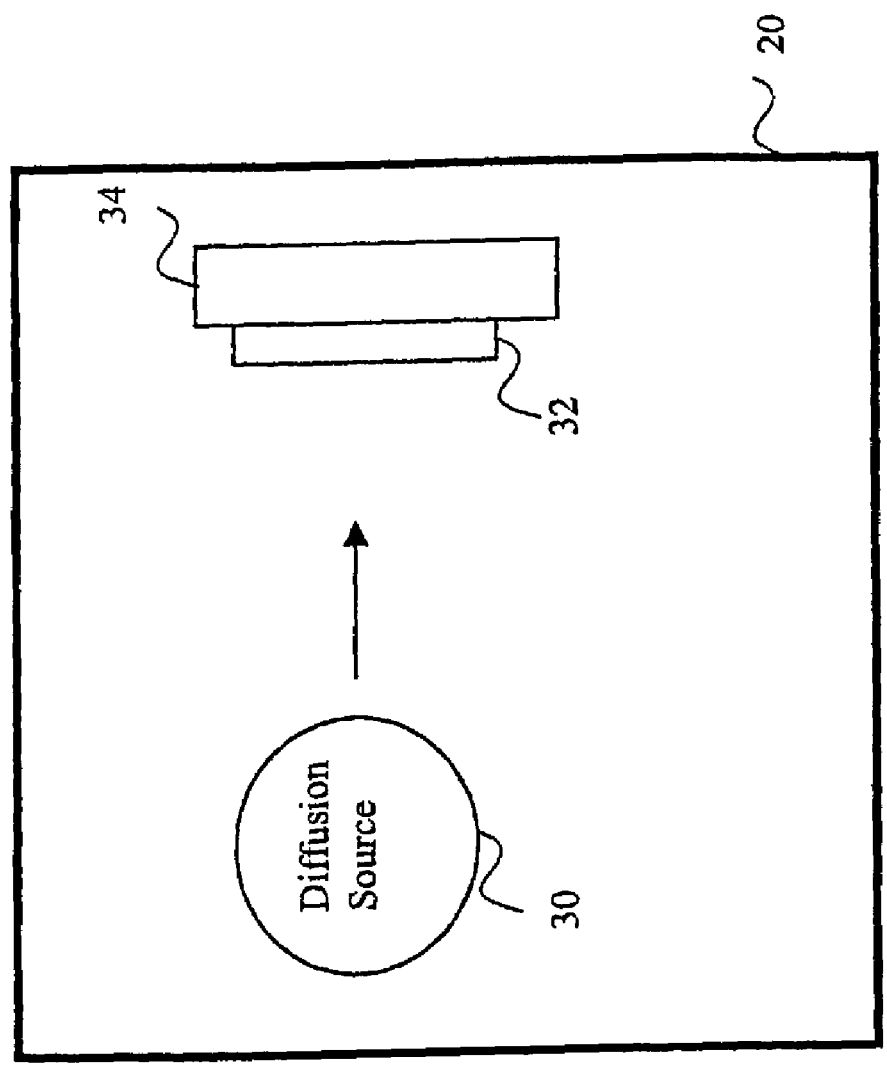
FIG. 1 is a general schematic block diagram of a fabrication system including a chamber.

Referring to FIG. 1, a substrate 32 is shown in a fabrication system 20 that is preferably used in both a Flash production line and in an SMOS production line. Fabrication system 20 can be exposed to germanium during SMOS processes associated with the SMOS production line. The exposure to germanium can be due to germanium outgassing, germanium deposition, germanium implantation, or other germanium-based processes or techniques.

Substrate 22 can be a semiconductor substrate such as silicon, gallium arsenide, germanium, or other substrate material. Substrate 32 can include one or more layers of material and/or features such as lines, interconnects, vias, doped portions, etc., and can further include devices such as transistors, microactuators, microsensors, capacitors, resistors, diodes, etc. Substrate 32 can be an entire IC wafer or part of an IC wafer. Substrate 32 can be part of an integrated circuit such as a memory, a processing unit, an input/output device, etc.

With reference to FIG. 1, fabrication system 20 is preferably a fabrication tool or fabrication equipment associated with a germanium fabrication process such as an SMOS process. In one embodiment, fabrication equipment 20 can be a diffusion furnace including a diffusion source 30. In another embodiment, fabrication system 20 can be a deposition chamber, an annealing furnace, an etching tool, or other device for processing substrate 32. Quartzware associated with system 20 is particularly susceptible to germanium contamination.

System 20 can include a chamber within which substrate 32 is provided. The chamber can generally include a stage 34 or a pedestal for holding substrate 32.

In one embodiment, system 20 can be utilized in a fabrication line associated with both a germanium process and a non-germanium process. During operation in the germanium process, system 20 can become contaminated with germanium and should be decontaminated before use in the non-germanium process.

Figure 2:
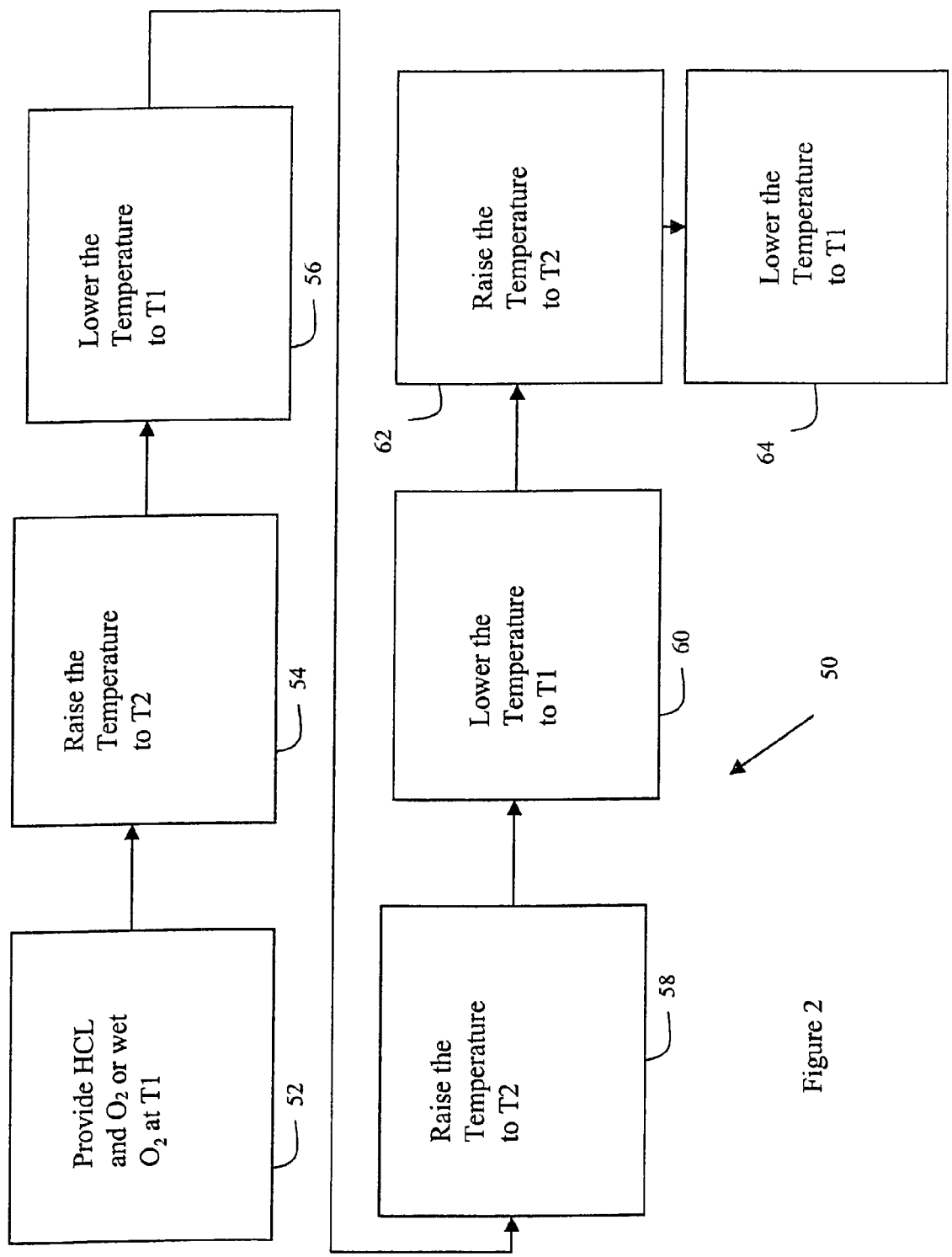
FIG. 2 is a flow diagram showing a decontamination process for the fabrication system illustrated in FIG. 1 in accordance with an exemplary embodiment.

With reference to FIG. 2, a process 50 can be utilized to clean or decontaminate system 20 (FIG. 1). Process 50 can be performed to convert germanium in system 20 to germanium oxide or germanium chloride. Germanium oxide and germanium chloride are volatile molecules which can be more easily removed from the chamber. Process 50 can reduce the germanium contamination below detection limits associated with vapor phase decomposition-inductively coupled plasma-mass spectrometry (VPD-ICP-MS) techniques.

In one embodiment, process 50 is utilized as a special clean-up process sequence. Process 50 can be utilized as a pre-clean step before system 20 is utilized in a non-germanium process or after system 20 reaches a predetermined limit of germanium contamination.

At a step 52, the chamber associated with system 20 is provided with a gaseous media. In one embodiment, a mixture of hydrochloric acid (HCl) gas and oxygen ($O_2$) gas is provided to the chamber of system 20. In an alternative embodiment, a wet oxygen (wet $O_2$) gas is provided to the chamber. The gas is preferably provided at a first lower temperature, such as at a load temperature of between approximately 600 and 700 degrees Celsius. Standard valves and fixtures for system 20 can be used to provide the gas into the chamber. Alternatively, system 20 can include additional inputs for receiving the source of the wet oxygen gas or the mixture of oxygen and hydrochloric acid gas. For example, one or more external process chambers, such as external torch chambers, may be used to provide steam or other gases into the chamber.

After the provision of the gas, the temperature within the chamber is raised to a second higher temperature. Preferably the second higher temperature is an elevated temperature such as between approximately 900 and 1,000 degrees Celsius. Chamber 120 can be placed in a furnace or may include a heating source to raise the temperature to the second higher temperature. Preferably, system 20 is maintained at the second higher temperature for a predetermined period of time. In one embodiment, the predetermined period of time is between approximately one and two hours.

In a step 56, the temperature within the chamber of system 20 is lowered to the load temperature. Alternatively, a lower temperature besides the load temperature can be chosen. In step 56, the temperature is maintained at the first lower temperature for a predetermined period of time, such as between approximately one and two hours.

In a step 58, the temperature is raised to the second higher temperature for a predetermined period of time. In a step 60, the temperature is lowered to the lower temperature for a predetermined period of time. In a step 62, the temperature is raised to the second higher temperature for a predetermined period of time. In a step 64, the temperature is lowered to the lower temperature for a predetermined period of time.

Steps 54–64 or portions thereof can be repeated as necessary for process 50. Preferably, process 50 includes from one to three cycles of steps similar to steps 54 and 56 to ensure decontamination of system 20 (e.g., the conversion of germanium to germanium chloride or germanium oxide).

Figure 3:
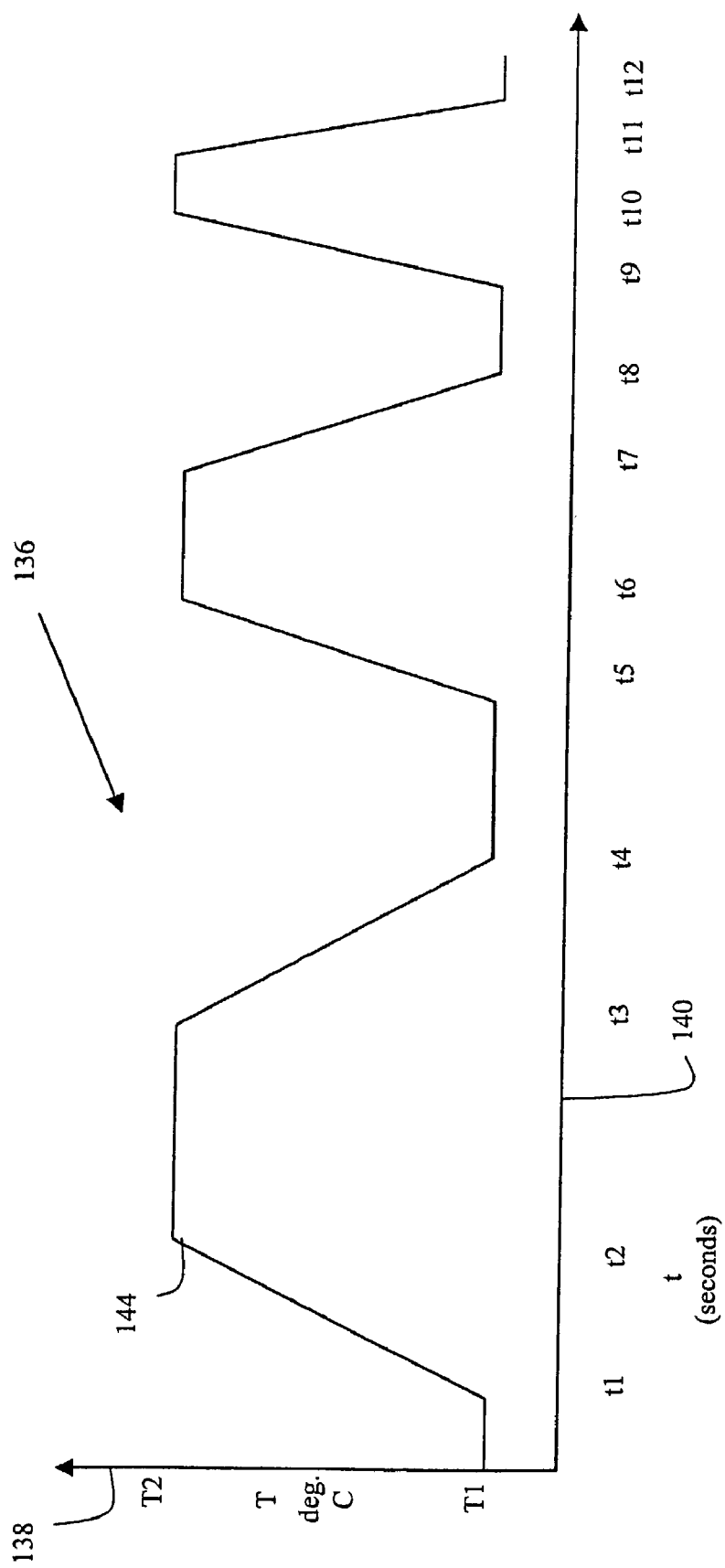
FIG. 3 is a graph showing temperature versus time in the chamber illustrated in FIG. 1 during the process illustrated in FIG. 2 in accordance with another exemplary embodiment.

With reference to FIG. 3, a graph 136 includes a curve 144 plotted with respect to a temperature axis 138 and a time axis 140. Preferably, curve 144 illustrates the temperature at steps of process 50 discussed with reference to FIG. 2. At time $t_1$ (step 52), a gas of HCl and $O_2$ or wet oxygen is provided in the chamber at a temperature $T_1$. At time $t_2$ (step 54), the temperature is raised to a temperature of $T_2$. At time $t_3$, the temperature begins to be lowered to temperature $T_1$ (step 56). At time $t_4$, the temperature reaches temperature $T_1$ and is maintained at that temperature until time $t_5$ (step 58). At time $t_6$, the temperature reaches temperature $T_2$.

At time $t_7$, the temperature begins to be reduced to temperature $T_1$ (step 60). At time $t_8$, the temperature is maintained at temperature $T_1$ for a period of time. At a time $t_9$, the temperature is raised in accordance with step 62 (FIG. 2) to temperature $T_2$.

At time $t_{10}$, the temperature is maintained at temperature $T_2$ until time $t_{11}$. At time $t_9$, the temperature is reduced to center until it reaches temperature $T_1$ at time $t_{12}$.

While process 50 has been described as using only two temperatures (e.g., a lower temperature $T_1$ and a higher temperature $T_2$), the temperatures may vary. For example, two or more different lower temperatures or two or more different higher temperatures may be used. In this manner, it is not required that the process for removing germanium contamination utilize only one lower and one higher temperature. Any combination of lower and higher temperatures may be used in alternative embodiments to convert residual germanium to germanium chloride or germanium oxide. Similarly, the amount of time that the process remains at a particular temperature may be varied depending on any of a variety of design considerations.

EXAMPLE 1

Process 50 can be performed with a mixture of an HCl and $O_2$ gas provided at approximately atmospheric pressure and an initial temperature $T_1$ of approximately 600 degrees Celsius. Higher temperature $T_2$ used during process 50 is preferably approximately 1000 degrees Celsius.

The timing cycles associated with Example 1 of process 50 are set forth below in Table 1, which should be read in conjunction with FIG. 3. Times $t_1$ through $t_{10}$ are set forth below in minutes.

TABLE 1

| | |
|---|---|
| $t_1$ | 20 min. |
| $t_2$ | 60 |

TABLE 1-continued

| | |
|---|---|
| $t_3$ | 120 |
| $t_4$ | 240 |
| $t_5$ | 260 |
| $t_6$ | 300 |
| $t_7$ | 340 |
| $t_8$ | 440 |
| $t_9$ | 460 |
| $t_{10}$ | 500 |
| $t_{11}$ | 520 |

Figure 4:
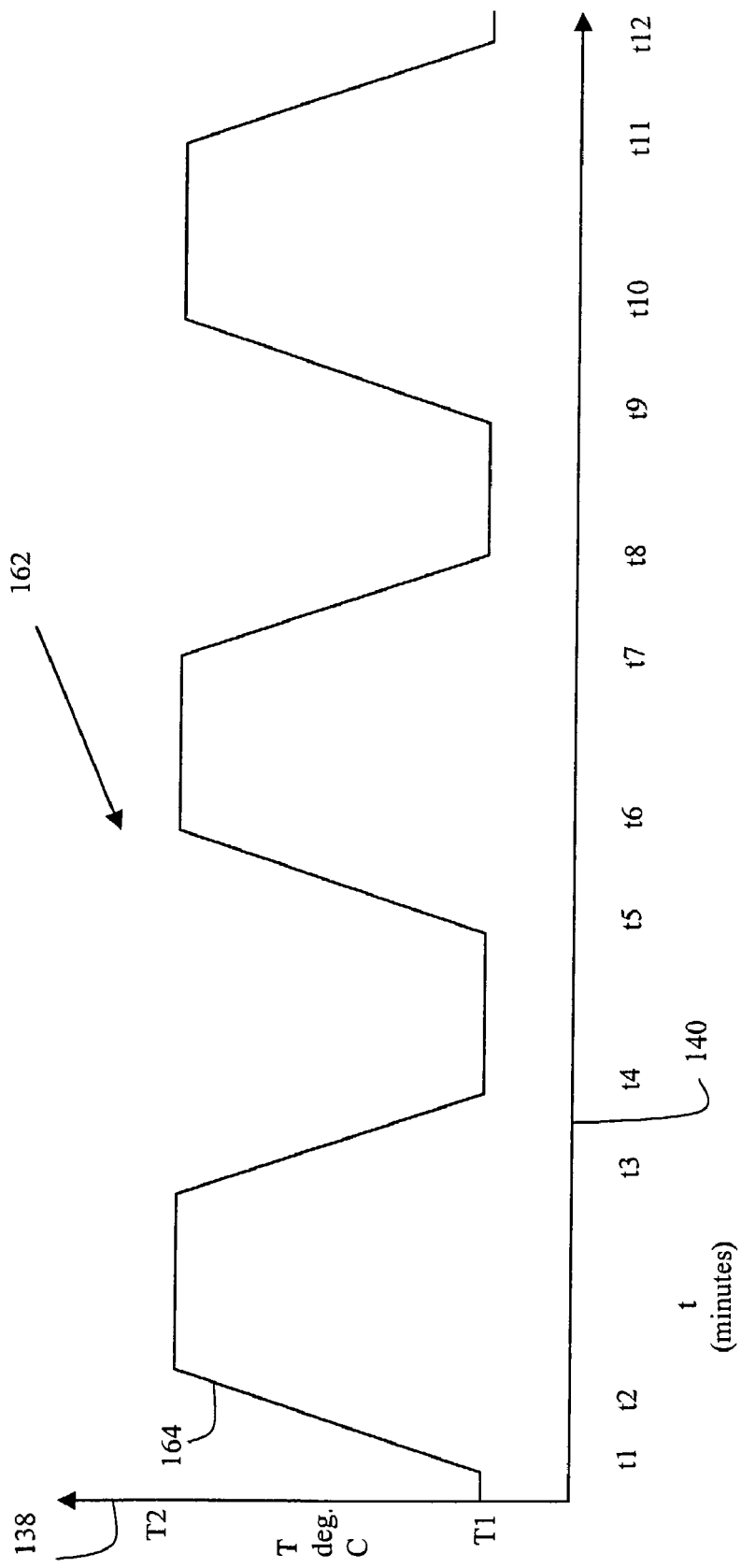
FIG. 4 is a graph showing temperature versus time in the chamber illustrated in FIG. 1 during the process illustrated in FIG. 2 in accordance with still another exemplary embodiment.

With reference to FIG. 4, process 50 is described with reference to graph 162. Graph 162 includes a curve 164 representing the temperature in the chamber of system 20 (FIG. 1) with respect to time. Unlike curve 144 (FIG. 3), curve 164 indicates relatively consistent time periods associated with the cycling between temperatures $T_1$ and $T_2$. In addition, the ramp time associated with changing between temperatures $T_1$ and $T_2$ is relatively constant constant. For example, in graph 162, $t_3$ minus $t_2$ is generally equal to $t_7$ minus $t_6$ and $t_{11}$ minus $t_{10}$. Similarly, $t_5$ minus $t_4$ is equal to $t_9$ minus $t_8$.

EXAMPLE 2

Example 2 is similar to Example 1 except that the timing parameters are adjusted. Table 2 set forth below shows timing parameters for Example 2. Example 2 can use a similar gas to Example 1 and may include temperatures $T_1$ and $T_2$ as provided in Example 1. The temperature response is shown in graph 162 (FIG. 4).

TABLE 2

| | |
|---|---|
| $t_1$ | 20 min |
| $t_2$ | 60 |
| $t_3$ | 120 |
| $t_4$ | 240 |
| $t_5$ | 260 |
| $t_6$ | 300 |
| $t_7$ | 360 |
| $t_8$ | 480 |
| $t_9$ | 500 |
| $t_{10}$ | 540 |
| $t_{11}$ | 600 |
| $t_{12}$ | 720 |

EXAMPLE 3

Example 3 is similar to Example 1 except that Example 3 utilizes a gas of wet oxygen rather than the mixture of HCl and $O_2$ gas of Example 1. For example, one possible mixture is created using a gas flow rate of between approximately 5 and 10 liters per minute for $O_2$ and between approximately 5 and 7 liters per minute of $H_2$. The $O_2$ and $H_2$ constituents thus react to form a gas of wet oxygen. The wet oxygen is heated in accordance with process 50 (FIG. 2) and graph 136 (FIG. 3) in accordance with the parameters shown in Table 1.

EXAMPLE 4

Example 4 utilizes a gas mixture similar to the gas mixture in Example 3. However, process 50 utilizes the timing parameters of Table 2 and graph 162 (FIG. 4).

Figure 5:
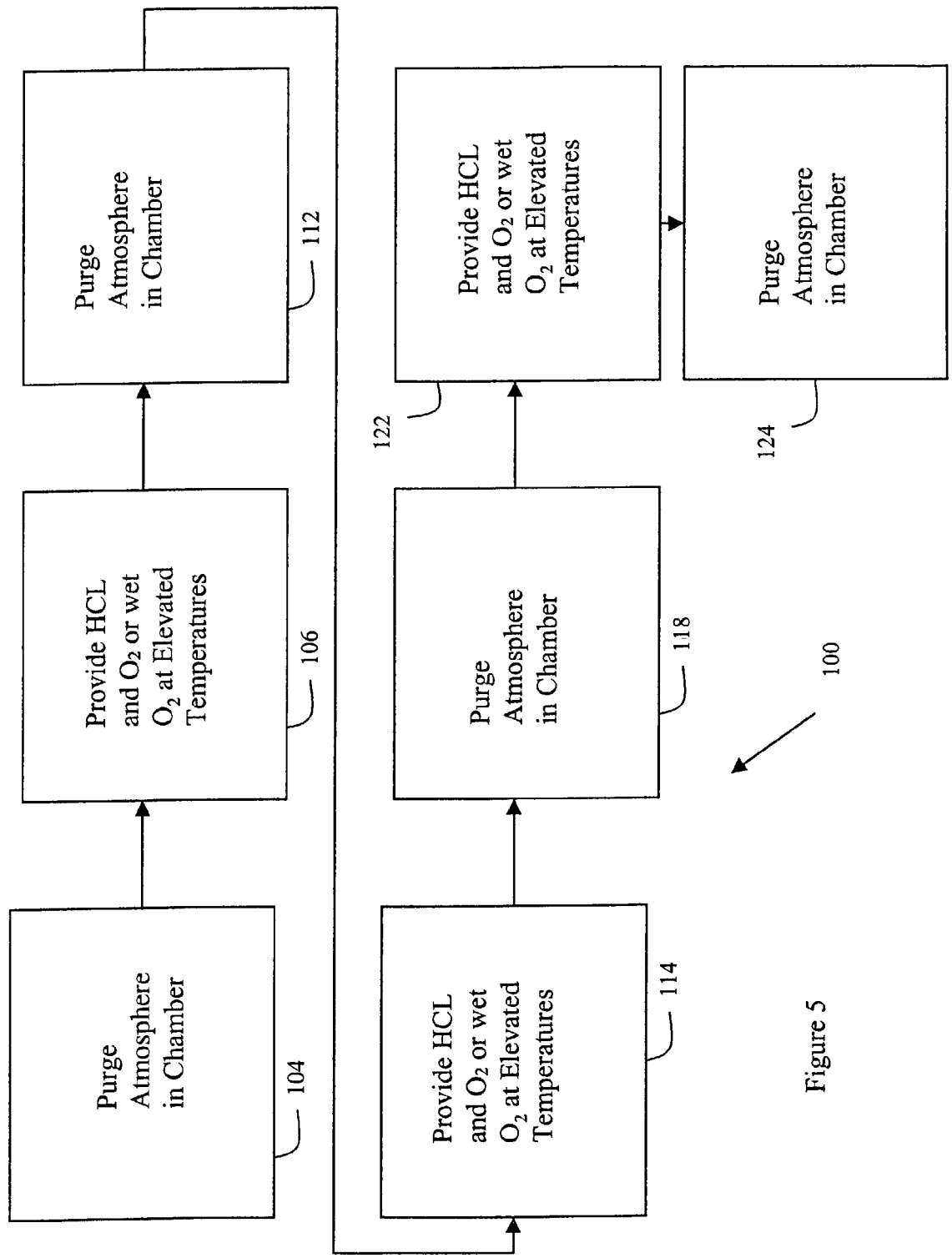
FIG. 5 is a flow diagram showing a decontamination process in accordance with yet another exemplary embodiment.

With reference to FIG. 5, in accordance with another exemplary embodiment, a process 100 can be utilized to remove germanium from system 20. Process 100 can be similar to process 50, except that purging or evacuation of the chamber is performed after elevating the temperature of system 20. More particularly, process 100 purges the atmosphere in the chamber associated with system 20 at a step 104.

At a step 106, an HCl and $O_2$ or wet oxygen gas is provided into the chamber associated with system 20. The HCl and $O_2$ or wet oxygen gas is preferably provided at both a lower temperature (e.g., step 52 of process 50 in FIG. 2) and at a higher elevated temperature (e.g., step 54 of process 50 in FIG. 2). The gas can be as described in Examples 1–4 and the temperature can be elevated and lowered as described in Examples 1–4.

After the temperature elevation, the temperature is lowered to the lower temperature and the atmosphere (the HCl and $O_2$ gas or wet oxygen gas) is purged in a step 112 to remove germanium contamination from the chamber as molecules of $GeCl_4$ or $GeO_2$. Alternatively, step 112 (purging) can be performed at the higher temperature associated with step 54 of FIG. 4 of process 50.

At a step 114, HCl and $O_2$ gas or wet oxygen gas is provided at elevated temperatures similar to step 106. The HCl and $O_2$ gas or wet oxygen gas is purged in a step 118. Step 122, similar to step 114, reintroduces HCl and $O_2$ gas or wet oxygen gas at elevated temperatures similar to steps 106 and 114. At a step 124, the mixture of HCl and $O_2$ gas or wet oxygen gas is purged.

In another alternative embodiment, process 100 can be modified such that process 50 is performed at step 106 and steps 112–122 are not performed. At step 124 after process 50 is completed, the atmosphere in the chamber associated with system 20 is purged.

It is understood that although the detailed drawings, specific examples, and particular values given provide exemplary embodiments of the present invention, the exemplary embodiments are for the purpose of illustration only. The method and apparatus in the aforementioned embodiments are not limited to the precise details and descriptions disclosed. For example, although particular germanium fabrication equipment is described, other types of tools can also be decontaminated. Various changes may be made to the details disclosed without departing from the scope of the invention which is defined by the following claims.

What is claimed is:

1. A method of performing decontamination of a chamber for use in an IC fabrication system, the chamber being exposed to germanium, the method comprising:
   providing wet oxygen or a mixture consisting essentially of hydrochloric gas and oxygen in the chamber;
   raising the temperature in the chamber from a first lower temperature to a second higher temperature to cause the wet oxygen or the mixture comprising hydrochloric gas and oxygen to react with the germanium.

2. The method of claim 1, wherein the second higher temperature is between 900 and 1000 degrees Celsius.

3. The method of claim 1, further comprising reducing the temperature to the first lower temperature.

4. The method of claim 3, further comprising increasing the temperature to the second higher temperature a second time.

5. The method of claim 4, further comprising reducing the temperature to the first lower temperature a second time.

6. The method of claim 5, further comprising increasing the temperature to the second higher temperature a third time.

7. The method of claim 6, wherein the first lower temperature is below 700 degrees Celsius.

8. The method of claim 6, wherein the chamber remains at the second higher temperature for between approximately 1 and 2 hours.

9. The method of claim 8, wherein the germanium reacts to form germanium chloride.

10. The method of claim 1, wherein the decontamination is preformed a diffusion furnace.

11. A method of decontaminating germanium contaminated equipment utilized in an SMOS process, the method comprising:
providing a gas consisting essentially of a wet oxygen or a mixture of hydrochloric gas and oxygen;
cycling the gas between a low temperature and a high temperature to cause the gas to react with germanium contaminants.

12. The method of claim 11, wherein the cycling step is performed at least three times.

13. The method of claim 12, wherein the gas is evacuated and replenished at the low temperature.

14. The method of claim 13, wherein decontamination of the equipment is preformed in a Flash production line.

15. A method of decontaminating an integrated circuit fabrication system, contaminated with germanium the method of:
introducing a gaseous material into a chamber of the fabrication system, the gaseous material comprising at least one of wet oxygen and a mixture comprising hydrochloric gas and oxygen;
adjusting the temperature within the chamber to cause the gaseous material to react with germanium included within the chamber and form a germanium-containing reaction product; and
purging the chamber of the germanium-containing reaction product.

16. The method of claim 15, wherein the germanium-containing reaction product comprises at least one of germanium chloride and germanium oxide.

17. The method of claim 15, wherein the material is introduced to the chamber at atmospheric pressure using an external torch assembly.

18. The method of claim 15, wherein the step of adjusting the temperature comprises increasing the temperature within the chamber to a temperature between 900 and 1000 degrees Celsius.

19. The method of claim 15, wherein the step of adjusting the temperature comprises cycling the temperature within the chamber between a first lower temperature and a second higher temperature.

20. The method of claim 19, wherein the second higher temperature is between 900 and 1000 degrees Celsius and the first lower temperature is below 700 degrees Celsius.

* * * * *